United States Patent [19]

Nishino et al.

[11] Patent Number: 4,481,431
[45] Date of Patent: Nov. 6, 1984

[54] CIRCUIT FOR DRIVING A SWITCHING TRANSISTOR

[75] Inventors: Hisao Nishino; Shigeru Kondo, both of Sendai, Japan

[73] Assignee: Tohoku Metal Industries, Ltd., Sendai, Japan

[21] Appl. No.: 601,735

[22] Filed: Apr. 19, 1984

Related U.S. Application Data

[63] Continuation of Ser. No. 338,119, Jan. 8, 1982, abandoned.

[30] Foreign Application Priority Data

Jan. 9, 1981 [JP] Japan .................................. 56-1163

[51] Int. Cl.$^3$ ........................ H03K 17/60; H03K 3/33
[52] U.S. Cl. .................................... 307/300; 307/253; 307/280
[58] Field of Search ............... 307/253, 280, 270, 300, 307/407, 412

[56] References Cited

U.S. PATENT DOCUMENTS

| | | | |
|---|---|---|---|
| 3,805,094 | 4/1974 | Orlando | 307/300 |
| 3,852,620 | 12/1974 | Milberger et al. | 307/300 |
| 3,983,418 | 9/1976 | Wallace | 307/300 |
| 3,986,052 | 10/1976 | Hunter | 307/300 |
| 3,999,086 | 12/1976 | Ekelund | 307/300 |
| 4,453,089 | 6/1984 | Shuey et al. | 307/300 |

Primary Examiner—Stanley D. Miller
Assistant Examiner—B. P. Davis
Attorney, Agent, or Firm—Frishauf, Holtz, Goodman and Woodward

[57] ABSTRACT

A circuit for driving a switching transistor which includes a driving pulse transformer having a primary winding to which a switching pulse is applied, a secondary winding connected to the base and the emitter of the switching transistor to turn on the switching transistor by the switching pulse applied to the primary winding, and a third winding. The third winding is connected to the emitter or the collector of the switching transistor so that the current flowing through the switching transistor of the on-condition flows through the third winding and induces a current on the secondary winding which is inverse to a current induced on the secondary winding by the switching pulse applied to the primary winding. The base-storaged carrier is rapidly drawn out after lapse of the switching pulse so that power dissipation is considerably reduced and high speed switching operation can be effected.

8 Claims, 7 Drawing Figures

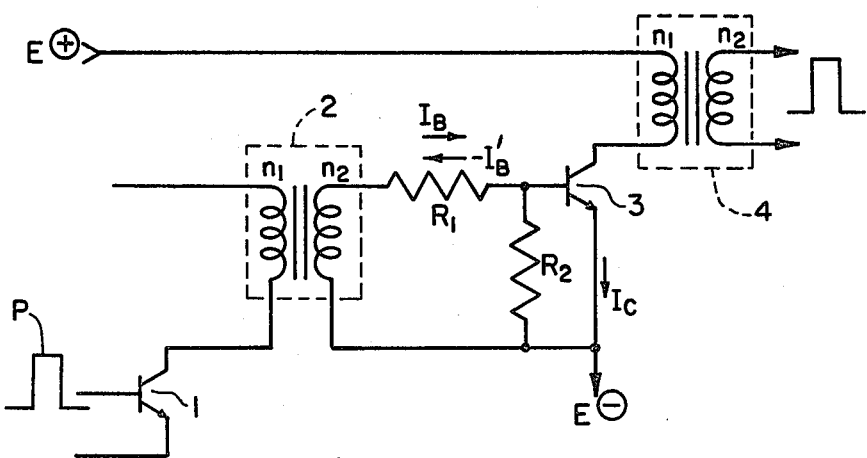
Fig.1 PRIOR ART
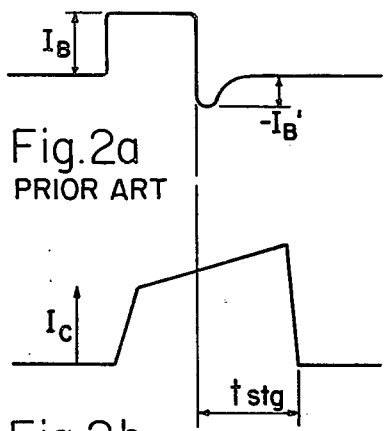
Fig.2a PRIOR ART
Fig.2b PRIOR ART
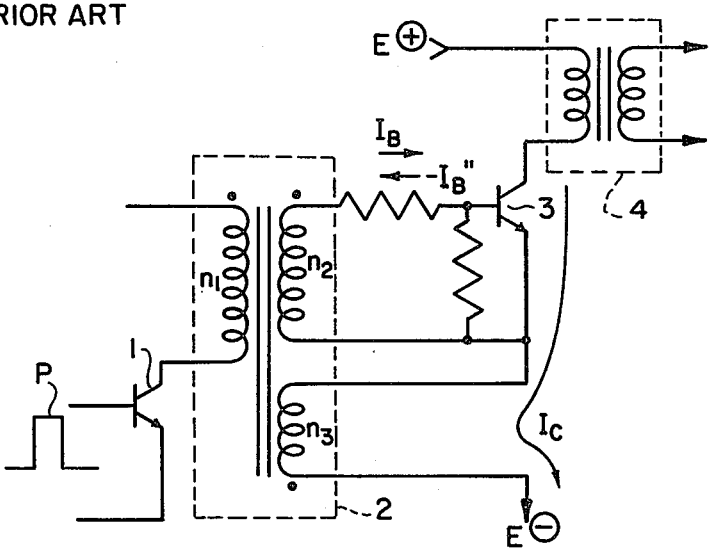
Fig.3
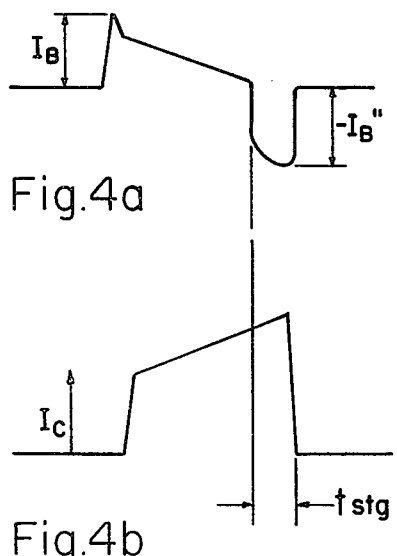
Fig.4a
Fig.4b
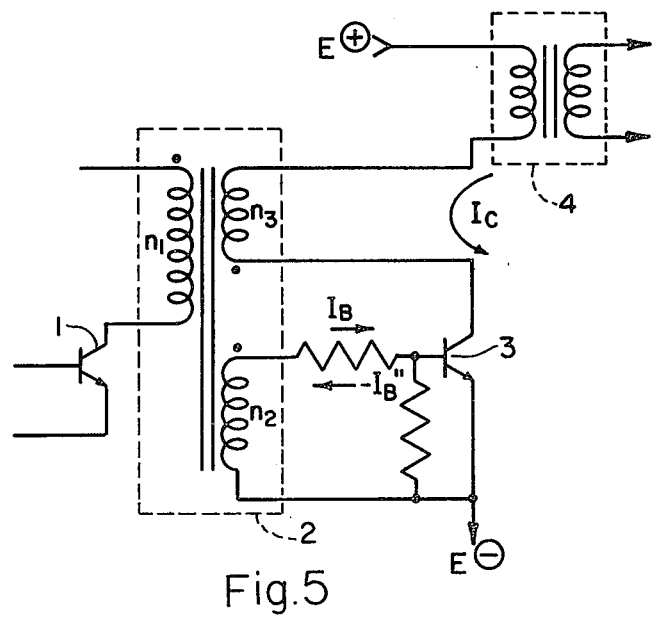
Fig.5

CIRCUIT FOR DRIVING A SWITCHING TRANSISTOR

This application is a continuation of application Ser. No. 338,119, filed Jan. 8, 1982, now abandoned.

BACKGROUND OF THE INVENTION

This invention relates to a circuit for driving a switching transistor used in, for example, switching regulators, and in particular, to such a driving circuit wherein the switching speed of the switching transistor is improved.

Voltage regulators of a switching type have been well known in the prior art and have been used in DC power supply devices for supplying regulated powers to various electronic devices.

One or more switching transistors are used in switching regulators and perform turn-on and turn-off operation under control by switching pulses. It is well known in the prior art that switching operation of the switching transistor cannot be effected at a rate higher than a certain speed by the reason of the carrier storage effect of the transistor. That is, when the switching transistor is turned off, current flow through the switching transistor is not stopped immediately but continued until the storaged carrier is consumed. Therefore, since the interval between the turn-off operation and the subsequent turn-on operation cannot be selected to be equal to, or shorter than, the carrier storage time, the switching transistor cannot effect the switching operation at a high repetition cycle. Moreover, the current flow due to the storage carrier results in power dissipation.

SUMMARY OF THE INVENTION

It is an object of this invention to provide a drive circuit for a switching transistor which enables the switching operation of the switching transistor at a high repetition cycle.

It is another object of this invention to provide a drive circuit for a switching transistor which can reduce the switching loss or power dissipation at switching operation.

It is still another object of this invention to realize the objects described above with simple circuit arrangement.

According to this invention, a circuit for driving a switching transistor is obtained which comprises a pulse transformer having a primary winding to which a switching pulse is applied, a secondary winding and a third winding. The switching transistor is coupled with the secondary winding of the pulse transformer at its base and emitter to thereby turn on at a time when the switching pulse is applied to the primary winding. The third winding is connected to the switching transistor in such a manner that the current flowing through the switching transistor of the on-condition flows through the third winding. The current on the third winding induces a current on the secondary winding which is inverse to a current induced on the secondary winding by the switching pulse applied to the primary winding.

In an aspect of this invention, the third winding is connected to the emitter of the switching transistor.

In another aspect of this invention, the third winding is connected to the collector of the switching transistor.

Further objects, features and other aspects will be understood from the following detailed description of preferred embodiments of this invention referring to the accompanying drawings.

BRIEF DESCRIPTION OF THE DRAWINGS

FIG. 1 is a circuit diagram of a known circuit for driving a switching transistor;

FIGS. 2a and 2b are views of waveforms of the base current and the output current of the switching transistor of the circuit in FIG. 1;

FIG. 3 is a circuit diagram of an embodiment of this invention;

FIGS. 4a and 4b are views of waveforms of the base current and the output current of the switching transistor of the circuit in FIG. 3; and FIG. 5 is a circuit diagram of another embodiment.

DETAILED DESCRIPTION OF PREFERRED EMBODIMENTS

Referring to FIG. 1, a known drive circuit for a switching transistor shown therein includes a transistor 1 for amplifying a switching pulse P. The collector of transistor 1 is connected with a primary winding $n_1$ of a pulse transformer 2. A secondary winding $n_2$ of pulse transformer 2 is connected between a base and an emitter of a switching transistor 3 through a base resistor $R_1$. A parallel resistor $R_2$ is connected between the base and the emitter of switching transistor 3. Switching transistor 3 is connected to a power source E at its collector and emitter through a primary winding $n_1$ of another pulse transformer 4.

In the arrangement, when a switching pulse P is applied to the base of transistor 1 from a pulse generator (not shown), it is amplified at transistor 1 and is applied to the base of switching transistor 3 through pulse transformer 2. So that switching transistor 3 is temporarily turned on. Therefore, a pulse current flows through primary winding $n_1$ of pulse transformer 4, so that an output current pulse is obtained from a secondary winding $n_2$ of pulse transformer 4.

However, switching operation of switching transistor 3 cannot be effected at a rate higher than a certain speed by the reason of the carrier storage effect of the transistor. That is, in order to turn on switching transistor 3, a base current $I_B$ must be large sufficient to saturate switching transistor 3, as shown in FIG. 2a. After lapse of the base current $I_B$, an inverse current $-I'_B$ flows to the base of switching transistor 3 due to the flyback energy of pulse transformer 2. However, the inverse current $-I'_B$ is considerably small in comparison with the base current $I_B$, or $I_B >> I'_B$, so that the carrier storage time $t_{stg}$ is long. Accordingly, the switching speed of switching transistor 3 cannot be increased. Moreover, since the carrier storage time $t_{stg}$ is long, the collector current is maintained during the carrier storage time $t_{stg}$ even after the switching base current $I_B$ lapses as shown in FIG. 2b so that power dissipation occurs.

This invention aims to resolve such disadvantages in a drive circuit for driving a switching transistor.

Referring to FIG. 3, an embodiment shown therein is similar to the known circuit of FIG. 1 except that pulse transformer 2 is provided with a third winding $n_3$ which is connected between the emitter of switching transistor 3 and the power source E. The parts similar to those in FIG. 1 are represented by the same reference marks.

It should be noted that third winding $n_3$ is connected in such a manner that a current $-I''_B$ inverse to the base current $I_B$ is induced onto secondary winding $n_2$ by the current $I_C$ flowing through third winding $n_3$ at a time when switching transistor 3 is turned on.

According to the arrangement, when a switching pulse P is applied to transistor 1, the base current $I_B$ starts to flow at the rise of the pulse, as shown in FIG. 4a, and switching transistor 3 is, therefore, turned on to permit the current $I_C$ to flow through third winding $n_3$. The current $I_C$ increases gradually, as shown in FIG. 4b. The inverse current $-I''_B$ is induced on secondary winding $n_2$ by the current $I_C$ flowing through third winding $n_3$, and the base current $I_B$, therefore, decreases by $I''_B$. The current $I''_B$ is expressed by $I_C \cdot n_3/n_2$, where $n_2$ and $n_3$ are winding numbers of the secondary and third windings of pulse transformer 2, respectively. Accordingly, after the base current $I_B$ due to the switching pulse P lapses, the large inverse current $-I''_B$ flows to the base of switching transistor 3, as shown in FIG. 4a. Therefore, the storage carrier is rapidly drawn out of the base of switching transistor 3, so that the storage time $t^{stg}$ is reduced. Accordingly, the power dissipation is reduced and the high speed switching operation can be effected.

In another embodiment of FIG. 5, the third winding $n_3$ of pulse transformer 2 is connected not between the emitter of switching transistor 3 and the power source E but between the collector of the switching transistor 3 and the power source E. In this arrangement, the similar operation is performed. That is, when switching transistor 3 turns on, the current $I_C$ flowing through the switching transistor 3 from power source E flows through the third winding $n_3$. Therefore, the inverse current $-I''_B (I''_B = I_C \cdot n_3/n_2)$ is induced on the secondary winding $n_2$ of pulse transformer 2. Accordingly, after the base current $I_B$ due to the switching pulse P lapses, the storaged carrier is rapidly drawn out of the base of the switching transistor 3.

This invention has been described in detail in connection with specific embodiments but they are examples only. It will be understood by those skilled in the art that this invention is not restricted to those embodiments but the other designations and various modifications can be made within the scope of this invention.

What is claimed is:

1. A circuit for driving a switching transistor comprising:
   a pulse transformer for transmitting a switching pulse to said switching transistor, said pulse transformer having a primary winding to which the switching pulse is applied, a secondary winding and a third winding;
   said switching transistor having a base and an emitter which are coupled with said secondary winding of said pulse transformer such that said switching transistor is turned on at a time when the switching pulse is applied to said primary winding; and
   said third winding being connected in series with the collector-emitter path of said switching transistor and said third winding being wound in a direction relative to the winding direction of said secondary winding such that the current flowing through said switching transistor when it is in the on-condition flows through said third winding, the current flowing through said third winding inducing a current in said secondary winding which is inverse to a current induced in said secondary winding by the switching pulse applied to said primary winding, whereby a base-storaged carrier of said switching transistor is rapidly drawn out to said third winding just after lapse of the switching pulse without requiring additional circuit elements to draw out said base-storaged carrier.

2. The circuit of claim 1, wherein said third winding is connected between said emitter of said switching transistor and a source of voltage.

3. The circuit of claim 1, wherein said third winding is connected between said collector of said switching transistor and a source of voltage.

4. The circuit of claim 3, further comprising a further pulse transformer having a primary winding which is coupled between said third winding and said source of voltage.

5. The circuit of claim 1, further comprising a further switching transformer having a primary winding coupled to said third winding.

6. The circuit of claim 5, wherein said collector of said switching transistor, said third winding and said primary winding of said further pulse transformer are coupled together in series.

7. A circuit for driving a switching transistor comprising:
   a first pulse transformer for transmitting a switching pulse to said switching transistor, said first pulse transformer having a primary winding to which the switching pulse is applied, a secondary winding and a third winding;
   said switching transistor having a base and an emitter which are coupled with said secondary winding of said first pulse transformer such that said switching transistor is turned on at a time when the switching pulse is applied to said primary winding;
   said third winding being coupled between said collector of said switching transistor and a source of voltage such that the current flowing through said switching transistor when it is in the on-condition flows through said third winding, the current flowing through said third winding inducing a current in said secondary winding which is inverse to a current induced in said secondary winding by the switching pulse applied to said primary winding, whereby a base-storaged carrier of said switching transistor is rapidly drawn out to said third winding just after lapse of the switching pulse; and
   a second pulse transformer having a primary winding which is coupled between said third winding of said first pulse transformer and said source of voltage.

8. The circuit of claim 7, wherein said collector of said switching transistor, said third winding of said first pulse transformer and said primary winding of said second pulse transformer are connected together in series.

* * * * *